United States Patent [19]

Peek

[11] 4,301,191
[45] Nov. 17, 1981

[54] METHOD OF PROVIDING A CONDUCTOR LAYER PATTERN HAVING PARTS WHICH ARE PRESENT AT A SMALL SEPARATION IN THE MANUFACTURE OF SEMICONDUCTOR DEVICES

[75] Inventor: Hermanus L. Peek, Eindhoven, Netherlands

[73] Assignee: U.S. Philips Corporation, New York, N.Y.

[21] Appl. No.: 115,972

[22] Filed: Jan. 28, 1980

Related U.S. Application Data

[63] Continuation of Ser. No. 962,831, Nov. 21, 1978, abandoned, which is a continuation of Ser. No. 759,714, Jan. 17, 1976, abandoned, which is a continuation of Ser. No. 618,771, Oct. 2, 1975, abandoned.

[30] Foreign Application Priority Data

Oct. 25, 1974 [NL] Netherlands .......................... 7413977

[51] Int. Cl.$^3$ ............................................ H01L 21/285
[52] U.S. Cl. .................................. 427/88; 204/192 C; 427/89; 427/91; 427/124; 427/125; 427/259; 427/282
[58] Field of Search ...................... 427/82, 89, 91, 282, 427/88, 124, 125; 156/652; 204/192 C

[56] References Cited

U.S. PATENT DOCUMENTS 3,700,510 10/1972 Keene et al. .................... 156/652
3,930,065 12/1975 Baker .................................. 427/89

FOREIGN PATENT DOCUMENTS 1378052 10/1964 France .................................. 427/91
978984 1/1965 United Kingdom .................. 427/99

Primary Examiner—John D. Smith
Attorney, Agent, or Firm—Thomas A. Briody; Robert T. Mayer; Paul R. Miller

[57] ABSTRACT

A method is set forth for providing on a substrate surface a conductor pattern having portions which are present at a mutual separation distance smaller than 10 microns by directed deposition of the material for the conductor portions in different directions through a mask which has apertures present comparatively closely beside each other. The mask is arranged at a small distance above the substrate surface. This method is suitable in particular for use in manufacturing semiconductor devices, for example, charge transfer devices.

13 Claims, 4 Drawing Figures

METHOD OF PROVIDING A CONDUCTOR LAYER PATTERN HAVING PARTS WHICH ARE PRESENT AT A SMALL SEPARATION IN THE MANUFACTURE OF SEMICONDUCTOR DEVICES

This is a continuation of Ser. No. 962,831, filed on Nov. 21, 1978, now abandoned which in turn is a continuation of Ser. No. 759,714, filed on Jan. 17, 1976, now abandoned, which in turn is a continuation of Ser. No. 618,771 filed Oct. 1, 1975, now abandoned.

The invention relates to a method of providing on a substrate surface a conducter layer pattern having portions which, at least locally, are present at a small mutual distance, by means of an apertured mask placed at some distance above the substrate surface and by directed depostion of the material or the materials of the conductor layer pattern in differently chosen directions relative to the substrate surface. The invention further relates to articles manufactured by using this method.

Such a method was known, for example, in semi-conducter technology, inter alia for the juxtaposed provision of an emitter and a base contact of a mesatransistor. In this case, a mask having a slot-shaped aperture was placed at some distance above the semiconductor body and the provision of the parts for the emitter and for the base contact was carried out by vapor deposition in a vacuum in different directions through the slot-shaped aperture in the mask. The distance between the mask and the semi-conductor substrate surface was large enough relative to the width of the slot-shaped aperture and the directions of vapor-deposition were sufficiently different so that one part deposited on the substrate through said aperture landed at some distance from the other part deposited through the same aperture. This method may present difficulties for obtaining in a reproducible manner an accurate very small distance between the metal depositions, for example, $10\mu$ or less. A difficulty is that the distance between the two depositions depends on the width of the aperture used in the mask, which width should be chosen in accordance with the desired width of the two metal depositions. For example, if it is desired to keep the width relatively large in relation to the desired distance between the two depositions, the angles of the directions of vapor-deposition to the normal on the substrate and/or the distance from the mask to the substrate should be chosen to be comparatively large, as a result of which the boundaries of the depositions are less accurately defined.

In those cases in which greater accuracies were required, in particular in semiconductor technology, deposition by vapor-deposition through a metal mask, at least to determine very accurate boundaries, was displaced by photo-lithographic methods using a layer of photoresist in which a given pattern was formed. However, in those cases a lower limit of the smallest dimensions of an aperture to be provided in the layer of photoresist or of a part of the layer of photoresist to be maintained between two apertures also had to be taken into account. It has proved possible with such a resist pattern to obtain metal layer portions at a small, accurately defined mutual distance of only $3\mu$.

One of the objects of the invention is to provide a method in which it is possible to provide two juxtaposed conductor layer portions by directed deposition, in which a much smaller mutual distance is realized.

According to the invention, a method of the kind mentioned in the preamble is characterized in that the mask is provided just above the substrate surface, in which mask juxtaposed apertures are formed which, at least locally, are separated from each other by a narrow mask portion, and the directed deposition is carried out through the apertures in at least two differently chosen directions in such manner that the conductor layer portions formed on the substrate surface by deposition through the juxtaposed apertures and separated from each other at that area achieve at that area at a mutual distance which is smaller than the width of the narrow mask portion present between the apertures and which is smaller than 10 $\mu$m.

The method according to the invention enables the obtaining of a minimum distance between the juxtaposed conductor layer portions which is smaller than the widths of the apertures in the mask used for providing the layer portions. The narrow mask portion between the apertures is preferably chosen to be very narrow, preferably even narrower than the relevant apertures themselves. By choosing such mask portion to be very narrow, the angles of the direction of vapor-deposition to the normal on the substrate surface and/or the distance between the mask and the substrate surface may be maintained comparatively small so that the accuracy is increased.

Since for carrying out the method according to the invention a comparatively small distance between the mask and the substrate surface will suffice, according to a preferred embodiment a first layer has a given thickness on the substrate surface which determines the desired distance between the substrate surface and the mask. The material of the mask may then be provided in the form of a second layer, after which the apertures may be provided in the second layer to form the mask. The material of the first layer, hereinafter termed "intermediate layer", may then be etched selectively, and as a result of this underetching, sufficient space is obtained below the apertures to provide the conductor layer portions while maintaining portions of the intermediate layer which serve as supports of the mask and as spacing members between the mask and the substrate surface, after which the directed deposition may be carried out. The thickness of the intermediate layer is preferably smaller than $5\mu$.

In particular when a very small distance between the conductor layer portions is to be obtained locally, a supporting part of the intermediate layer below the narrow mask portion between the apertures may be annoying. Therefore, the material of the intermediate layer below the narrow mask portions is preferably etched away entirely with the under-etching used, while maintaining portions of the intermediate layer below wider portions of the mask.

After providing the conductor layer portions, the mask may simply be removed by dissolving the remaining parts of the intermediate layer.

The invention provides the possibility of providing conductor layer portions at a mutual distance of less than $2\mu$, for example, at most $1\mu$. The width of the narrow mask portion between the apertures in the mask need not be chosen to be extremely small and may be, for example, $3\mu$ or more. Furthermore, the method according to the invention in which two juxtaposed apertures in the mask are used, each for providing one of the two conductor layer portions present at a small distance from each other, presents the possibility of providing more than two conductor layer portions by using a row of apertures in the mask present at a short distance from each other. A row of conductor layer portions are obtained in which each conductor layer portion is present at a very short distance from the adjacent conductor layer portion or the adjacent conductor layer portions.

Since the invention provides the possibility of realizing conductor layer portions at a very small distance from each other, the invention is of particular importance for the manufacture of semiconductor devices. Therefore, according to a further aspect of the invention, a method of manufacturing semiconductor devices having at least two conductor layer portions at a very small mutual separation or distance is characterized by steps in which the conductor layer portions are provided on a surface of a semiconductor material substrate in the above-described manner according to the invention.

Prior to providing the conductor layer portions, a substrate portion of semiconductor material is preferably provided, on the side of the substrate surface, with an insulating layer covering the semiconductor portion at least partly. This may be an insulating layer comprising silicon dioxide, silicon nitride and/or aluminum oxide with at least one of the conductor layer portions being provided at least partly on the insulation layer. It is possible that such a conductor layer portion also partly covers directly a part of the semiconductor surface, for example, in a window provided in the insulating layer.

It is also possible to use the conductor layer portion on the insulating layer as an electrode in a conductor-insulator-semiconductor (MIS) structure, for example, as a gate electrode of an insulated gate field effect transistor (IGFET) or as an electrode of a capacitor, in particular with voltage-dependent capacitance.

The invention is of particular advantage in the manufacture of charge transfer devices (CTD) for example, "bucket brigades" or charge-coupled devices (CCD). It is known in such charge transfer devices to use two or more juxtaposed conductor layer portions in the form of strips which are separated from an underlying semiconductor portion by a thin insulating layer and serve as gate electrodes (gates) of the transfer devices. The gate electrodes form with the underlying semiconductor material capacitance through which charge can be accumulated. By means of so-called "clock pulses", the charge can be transferred to a semiconductor region below an adjacent electrode. In this manner, charge which has accumulated below the first gate electrode, can be shifted by successive clock pulses to regions coupled to successive gate electrodes. It is of importance to keep the loss factor in shifting the charge (so-called "transport inefficiency") low and to cause it to be the same as much as possible throughout the device. For that purpose it is of importance to achieve between each set of juxtaposed gate electrodes distances which are as small as possible and are preferably uniform without breakdown occurring from one gate electrode to the other. By means of the invention such very small uniform distances can be particularly realized.

The directed deposition is preferably carried out by vapor-deposition in a vacuum but it may also be effected differently. For example, sputtering, in particular such as metals which are difficult to evaporate, tungsten, molybdenum or tantalum, is used for the conductor layer portions. In semiconductor technology, aluminum which is usual for conductors and contacts, may be used at those areas with the aluminum being preferably provided by vapor-deposition. Gold and copper may also be deposited in this manner.

It is also possible to use silicon, for example, in a polycrystalline form, for the conductor layer portions. In principle, silicon may also be vapor-deposited or sputtered. If desired, a dopant may be added to the silicon simultaneously with or after provision of the silicon.

The invention furthermore relates to products, and in particular semiconductor devices, obtained by using the method according to the invention.

The invention will be described in greater detail with reference to an example and the accompanying drawing.

For the manufacture of a charge-coupled device (CCD) a layer 2 of silicon oxide having a thickness of 0.2 $\mu$m (see FIG. 2) is formed on a semiconductor wafer 1 of which at least a surface layer consists of monocrystalline P-type silicon having a resistivity of, for example, 10 ohm.cm. The assembly of silicon wafer 1 and oxide layer 2 constitutes a substrate having the surface 3 of which, at the side where the oxide layer 2 is present, rows of conductive tracks are provided the tracks being coupled capacitively to the underlying semiconductor material through the thin oxide layer 2. For provision of the conductive tracks, for example of aluminium, a directed deposition process through an apertured mask is chosen.

For provision of the mask at an accurately determined distance from the substrate surface 3, in this example a distance of 2 $\mu$m, a first layer of molybdenum, 2 $\mu$m thick, is provided by sputtering. The first layer forms the spacing member for the mask to be used to provide the conductor layer portions. The material for the mask in the form of a second layer is provided thereon, for example, likewise by sputtering, in this case gold, to form a gold layer, 1 $\mu$m thick. The mask 10 is formed herein by means of a known photolithographic etching process with the use of a known etching bath for gold on the basis of cyanide.

Figure 1:
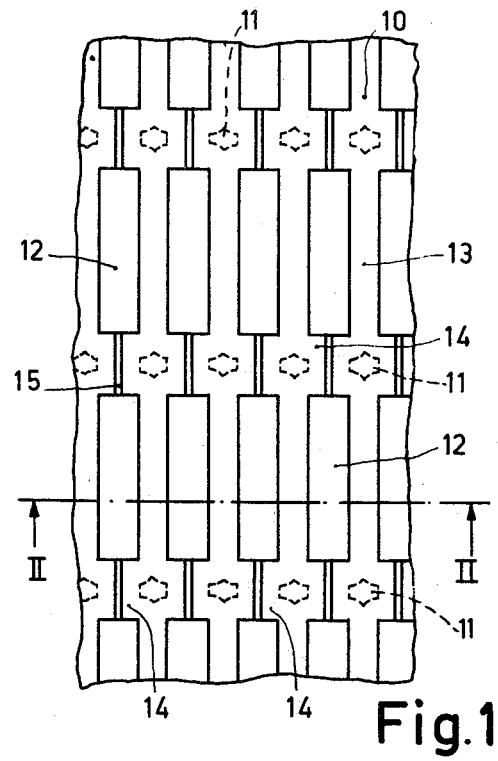
FIG. 1 is a diagrammatic detail of a plan view of a substrate surface over which a mask is provided having apertures for a directed deposition of conductor layer portions on the substrate surface.
Figure 2:
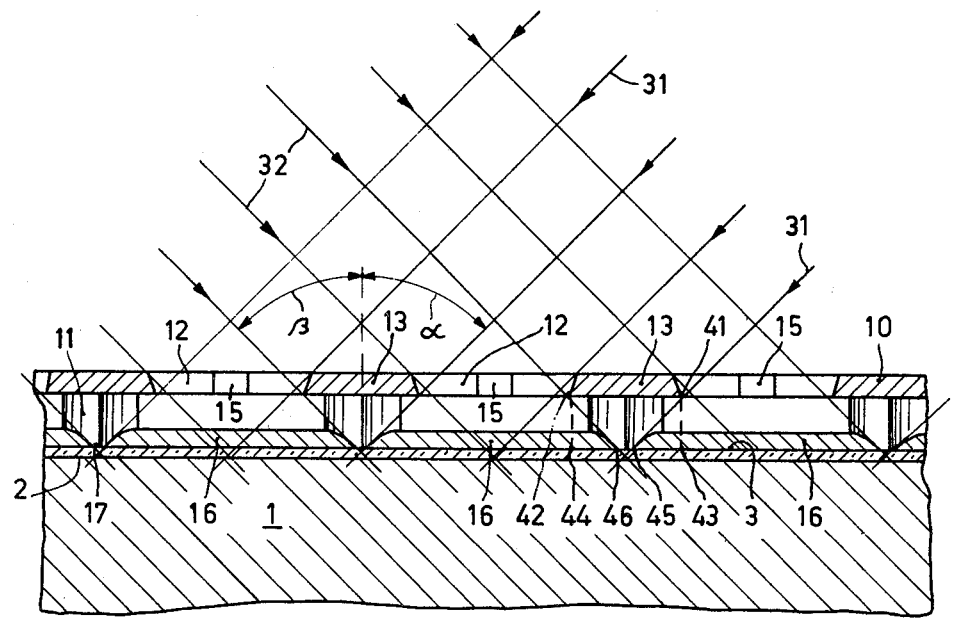
FIG. 2 is a diagrammatic vertical sectional view taken on the line II—II of FIG. 1 after the deposition.

The resulting juxtaposed elongate apertures 12 of the mask 10 have a length of, for example, 20$\mu$ and a width of 6$\mu$ (see FIGS. 1 and 2). The apertures 12 which are situated beside each other in the width directions are separated from each other by narrow beam-like mask portions 13, 4$\mu$ wide. The apertures 12 are also arranged in rows in their longitudinal directions and the apertures 12 present in each of the rows are connected together by narrow grooves 15 exceeding the thickness of the layer and having a length, for example, of approximately 10 $\mu$m and a width of approximately 3 $\mu$m. The grooves are separated from each other by mask portions 14, approximately 7μ wide, which is much wider than the mask portions 13.

The gold mask 10 is first used as an etching mask to remove molybdenum from those places on the substrate surface where deposition is to take place. Since the conductor layer portions provided on the substrate surface 3 should cover a larger area than the apertures 12 in the mask through which the directed deposition is to be carried out, the etching away of the molybdenum, for example with nitric acid, is continued until a considerable underetching below the gold mask takes place in such manner that all the molybdenum has been removed below the narrow mask portions 13. However, the process is discontinued sufficiently in time to maintain below the wide mask portions 14 spacing members 11 between the mask 10 and the substrate surface 3 serving also for supporting the mask 10.

The deposition of the conductor layer portions to be provided is then carried out. For this purpose, in the present example, aluminum is vapor-deposited in a vacuum. Two evaporation sources and the substrate with mask are placed relative to each other as is shown diagrammatically in FIG. 4. The substrate with mask is shown diagrammatically by the rectangle 20 the side 23 of which shows diagrammatically the surface with the mask which is flat, at least macroscopically. The places of the two evaporation sources are denoted diagrammatically by the crosses 21 and 22. The distance above the plane of the surface 23 is substantially the same. These surfaces lie on the plane, denoted by 24 and 25, respectively, which is present at the crossings of the broken lines denoting the extention of the surface 23 and the normals 26 and 27 extending thereon from 21 and 22, respectively.

In the present case, helically wound wires of tungsten are used for the evaporation sources 21 and 22 of aluminum. The wires are placed parallel to each other with their straight axes extending in a direction perpendicular to the plane of the drawing of FIG. 4, and the substrate with mask 20 is arranged so that the surface 23 and also the longitudinal direction of the narrow mask portions 13 (see FIG. 1) are located parallel to the axes of the coiled evaporation wires. In the present example and in agreement with a preferred embodiment the distances 26 and 27 are mutually equal. The coiled tungsten wires are provided with riders consisting of the aluminum to be evaporated. The vapor deposition takes place in an evacuated space by the passage of current through the two coiled tungsten wires as a result of which the aluminum first melts to become spread over the surface of the tungsten wire, and then it evaporates. In vacuum the evaporated aluminum particles spread according to straight paths from the two evaporation sources. A point 28 on the surface 23 receives aluminum particles in two directions, namely in a direction denoted by the arrow 31 from evaporation source 21, and in a direction denoted by the arrow 32 from evaporation source 22. These directions enclose angles $\alpha$ and $\beta$, respectively, with the normal to the plane 23. Tan $\alpha$ is determined by the quotient of the distance from point 28 to the base point 24 divided by the length of the line 26 and tan$\beta$ is determined by the quotient of the distance from point 28 to base point 25 divided by the length of the line 27 which in this case is equal to the length of the line 26.

Figure 3:
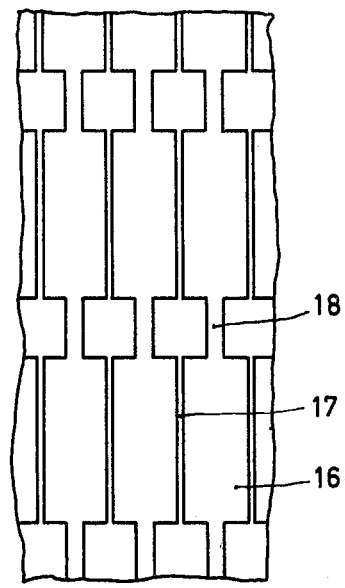
FIG. 3 is a diagrammatic detail of the plan view shown in FIG. 1 after the deposition of the conductor layer portions and after removal of the mask.
Figure 4:
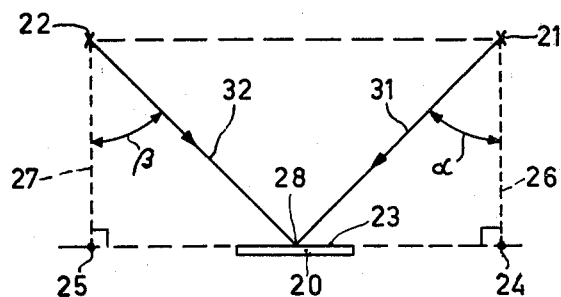
FIG. 4 shows a diagrammatic arrangement of the substrate and of the evaporation sources during the deposition of the conductor layer portions shown in FIG. 2.

As a result of the vapor deposition in the two directions according to the arrows 31 and 32, aluminum layer portions 16 are deposited through the apertures 12 in the mask 10, which portions are wider than the apertures 12 and have an intermediate space 17 the width a of which is narrower than the width b of the narrow mask portion 13 (see FIGS. 2 and 3). The boundary 45 of the intermediate space 17 is determined by the boundary 41 of the mask portion 13 and the vapor-deposition direction 31 with the distance from boundary 45 to the base point 43 of the boundary 41 on the substrate surface 3 being equal to dtan $\alpha$, d being the distance between the mask and the substrate surface. The boundary 46 of the intermediate space 17 is determined by the boundary 42 of the mask portion 13 and the vapor-deposition direction 32 with the distance from said boundary to the base point 44 of the boundary 42 on the substrate surface 3 being equal to dtan$\beta$. From this calculation it follows that the width A of the narrow intermediate space 17 between juxtaposed conductor layer portions 16 is given by the formula a=b−d(tan$\alpha$+tan$\beta$). As is shown in FIG. 4, the value of the factor (tan +tan$\beta$) is equal to the quotient obtained by dividing the sum of the distances from each of the base points 24 and 25 to the point 28 on the surface 23 by the distance 26. The distance 26 actually is equal to the distance 27. For the last-mentioned sum may be taken the overall distance between the base points 24 and 25 which in turn is equal to the distance between the evaporation sources 21 and 22. From this calculation it follows that the quantity (tan$\alpha$+tan$\beta$) is independent of the selected place on the surface 23. From this it follows that an important condition is satisfied to be able to get the width of the intermediate spaces 17 throughout the wafer equal when the width of all the narrow mask portions 13 above the substrate is equal (see FIG. 2).

In the present example the distances 26 and 27 are 12 cm and the distance between the evaporation sources 21 and 22 is 21 cm. (compare FIG. 4).

With a distance d between the mask 10 and the substrate surface 3 or 2 μm and width b of the narrow mask portions 13 of 4μ it follows that the width a of the intermediate spaces 17 between the conductor layer portions 16 according to the above-mentioned formula is 4μ−2×21/12μ=0.5μ. The width of the strip-shaped conductor portions 16 is 9.5μ with a width of the apertures 12 in the mask 10 of 6μ.

The mask 10 may now be removed by etching away the supports 11 of molybdenum so that the mask detaches from the substrate. FIG. 3 is a plan view of a part of the substrate surface 3 having the conductor layer portions 16 separated by a very small intermediate space 17. For the manufacture of CCD's conductor layer portions 16 present in the longitudinal direction of each other are connected together by metal strips 18 formed by deposition through the grooves 15 in the mask 10 (compare FIG. 1). The width of strips 18 and the correct location thereof are less critical when the width is chosen to be fairly smaller than that of the conductor layer portions 16.

It is to be noted that it is known in a charge transfer device (CTD) to use a number of rows of MIS capacities across each row in which charge transport can take place. Charge transfer through the semiconductor from one row to another is counteracted, for example, by using channel interrupting zones or a locally thicker oxidation layer which if desired, may be sunk in the semiconductor, or in other manner. In the present case in which wider conductor layer portions 16 are obtained at mutually very small separations or distances 17 and narrow connection strips 18 are obtained at larger, non-critical mutual distances, the structure may advantageously be used by restricting the small very critical intermediate spaces 17 and the associated wider conductor layer portions 16 to those places which are essential for the operation of the charge transfer device in a direction transverse to the longitudinal direction of the conductor layer portions 16. In the places where the charge transfer from one row of capacities to a parallel row is counteracted and where such a critical small intermediate space is not required, the metal strips 18 and the mutually larger non-critical distances are used. Structures including juxtaposed conductor tracks having mutually small intermediate spaces in places operative for charge transfer and having larger intermediate spaces in places present between the charge transfer rows where such narrow intermediate spaces are useless, have the advantage that the overall length of the narrow intermediate spaces is restricted. Hence the possibility of shortcircuiting between juxtaposed conductors as a result of a local design error is reduced relative to corresponding CTD structures of known type having a number of juxtaposed rows of capacities for charge transfer, and in which conductor tracks provided transversely to such rows are separated from each other throughout their length by narrow, critical intermediate spaces. This advantage which is associated with the structure of juxtaposed conductor tracks of a CTD having a number of parallel rows of MIS capacities for charge transfer also applies when the conductor tracks are provided with alternately larger and smaller mutual distances in a manner other than that described above.

The proceding example relates to a configuration of conductor layer portions on a substrate comprising a semiconductor covered with an insulating layer, which cnfiguration may be used in a CCD. Although the invention is suitable in particular for the manufacture of such a CCD, the invention is not restricted to this. For example, it may be used for the manufacture of other semiconductor devices where a small distance between metal layer portions is desired, for example, in other MIS configurations, in bipolar transistors and photosensitive devices. It is possible to provide comb-shaped interdigitating electrodes separated from each other at a very small distance and having a meander-like intermediate space so as to separate both conductors from each other. If desired, local widenings in said intermediate space may be used so as to enable the application of supports for the apertured mask consisting of portions of an intermediate layer.

Conductor layer portions provided on a substrate at a short distance from each other may also serve for other applications which need not be restricted to the manufacture of semiconductor devices. For example, the intermediate space may be used as an optical slit. The conductor layer portions themselves may also serve as a mask for treatments of a substrate having a very narrow slit, for example, as an etching mask, as a diffusion or ion implantation mask in semiconductor technology, and the like.

Furthermore, the use of the invention is possible in those cases in which it is desired to provide the conductor layer portions locally with a narrow interspace, and to connect them together elsewhere.

What is claimed is:

1. A method of forming on a substrate surface a conductor layer pattern having portions which are at least locally separated by small mutual distances, comprising the steps of:

(a) forming a mask over said substrate surface, said mask comprising a first layer having a plurality of juxtaposed apertures extending therethrough and being at least locally separated by narrow mask portions, and a second layer supporting said first layer above said substrate surface and having a plurality of openings between said apertures and said substrate surface, said openings being larger than said apertures, said second layer having a predetermined thickness for separating said first layer from said substrate surface, and (b) depositing single conductive layers of a material in at least two different directions through each of said apertures onto said substrate surface, both of said different directions being angularly disposed to a normal to said substrate surface, and said deposition in each of said different directions through a given aperture contributing to formation of a single conductor layer portion on said substrate surface, said single conductor layer portions formed through each of said apertures being relatively disposed on said substrate surface at separations being smaller than widths of said narrow mask portions between apertures, said separations being smaller than 10 microns, and said separations being smaller than respective widths of said apertures.

2. A method as in claim 1, wherein said narrow mask portions between said apertures is narrower than said apertures.

3. A method as in claim 1, wherein said narrow mask portions have a width of at least 3 microns.

4. A method as in claim 1, wherein said separations between said conductor layer portions are smaller than 2 microns.

5. A method as in claim 4, wherein said separations between said conductor layer portions are at most 1 microns.

6. A method as in claim 1, wherein said substrate surface, at least macroscopically, is located in a flat plane and said deposition is carried out rectilinearly from at least two sources present at a distance from each other and at equal distance from said flat plane.

7. A method as in claim 1, wherein said deposition is carried out by vapor deposition in a vacuum.

8. A method as in claim 1, wherein said second layer is removed entirely below said narrow mask portions except for a plurality of spacing members to support said first layer on said substrate surface.

9. A method as in claim 8, wherein said second layer has a thickness of less than 5 microns.

10. A method as in claim 1, wherein said mask comprises at least two apertures in a row which, at least locally, are separated from each other by said narrow mask portions.

11. A method as in claim 1, wherein prior to provision of said conductor layer portions, at least a portion of said substrate surface is provided with an insulation layer, and at least one of said conductor layer portions is provided at least partly on said insulation layer.

12. A method as in claim 11, wherein at least one of said conductor layer portions provided on said insulating layer constitutes an electrode in a conductor-insulator-semiconductor structure.

13. A method as in claim 11, wherein charge transfer devices are formed having two or more juxtaposed conductor layer portions present at a small distance from each other on said insulating layer to form a series of gate electrodes for said devices coupled capacitively to the underlying semiconductor material.

* * * * *

UNITED STATES PATENT AND TRADEMARK OFFICE
CERTIFICATE OF CORRECTION

PATENT NO. : 4,301,191
DATED : November 17, 1981
INVENTOR(S) : HERMANUS L. PEEK

It is certified that error appears in the above-identified patent and that said Letters Patent is hereby corrected as shown below:

In the claims:

Column 8, claim 5, line 3

"microns" should be --micron--.

Signed and Sealed this

Fifteenth Day of January 1985

[SEAL]

Attest:

Attesting Officer

GERALD J. MOSSINGHOFF

Commissioner of Patents and Trademarks